United States Patent
Park et al.

(10) Patent No.: US 8,502,391 B2
(45) Date of Patent: Aug. 6, 2013

(54) SEMICONDUCTOR DEVICE AND METHOD OF MAKING SINGLE LAYER SUBSTRATE WITH ASYMMETRICAL FIBERS AND REDUCED WARPAGE

(75) Inventors: Hyung Sang Park, Kyoggi-do (KR); Sung Soo Kim, Seoul (KR); SungWon Cho, Kyoung-gi-Do (KR)

(73) Assignee: STATS ChipPAC, Ltd., Singapore (SG)

( * ) Notice: Subject to any disclaimer, the term of this patent is extended or adjusted under 35 U.S.C. 154(b) by 82 days.

(21) Appl. No.: 13/314,984

(22) Filed: Dec. 8, 2011

(65) Prior Publication Data

US 2013/0147053 A1     Jun. 13, 2013

(51) Int. Cl.
   *H01L 29/40*    (2006.01)
   *H01L 23/28*    (2006.01)

(52) U.S. Cl.
   USPC .......................................................... 257/774

(58) Field of Classification Search
   USPC .................. 174/258, 250, 261, 254; 427/322, 427/97.6; 428/209; 257/774, 618–628, E21.122–E21.128, E21.567–E21.57, E21.577–E21.588; 438/963–974, 637–640, 438/668, 12, 13, 115, 458, 459
   See application file for complete search history.

(56) References Cited

U.S. PATENT DOCUMENTS

| | | | |
|---|---|---|---|
| 6,417,459 B1 * | 7/2002 | Kanzaki et al. ............... | 174/254 |
| 7,707,715 B2 | 5/2010 | Okabe et al. | |
| 2008/0024684 A1 | 1/2008 | Park et al. | |
| 2008/0115355 A1 | 5/2008 | Park et al. | |
| 2009/0011220 A1 | 1/2009 | Park et al. | |
| 2009/0071703 A1 * | 3/2009 | Imahori et al. ................ | 174/261 |
| 2009/0101510 A1 | 4/2009 | Kang | |
| 2009/0126974 A1 * | 5/2009 | Yuasa et al. .................... | 174/250 |
| 2009/0229869 A1 * | 9/2009 | Harada et al. .................. | 174/258 |
| 2009/0255714 A1 * | 10/2009 | Sohn et al. ..................... | 174/250 |
| 2010/0078213 A1 | 4/2010 | Furutani et al. | |
| 2010/0294554 A1 * | 11/2010 | Okazaki ......................... | 174/261 |
| 2011/0024170 A1 * | 2/2011 | Nagasawa ...................... | 174/258 |
| 2011/0061231 A1 | 3/2011 | Hwang et al. | |

* cited by examiner

*Primary Examiner* — Dao H Nguyen
*Assistant Examiner* — Tram H Nguyen
(74) *Attorney, Agent, or Firm* — Robert D. Atkins; Patent Law Group: Atkins & Associates, P.C.

(57) ABSTRACT

A semiconductor device includes a first carrier having a first resin disposed over the first carrier. A fabric is disposed over the first resin. A second resin is formed over the first resin and around the fabric to form an asymmetrical pre-impregnated (PPG) substrate. The first carrier is removed. A second carrier is provided and a first conductive layer is formed over the second carrier. A portion of the first conductive layer is removed. The first conductive layer is transferred from the second carrier to the first resin. The first conductive layer is oriented asymmetrically such that the first conductive layer is offset with respect to the fabric to minimize warpage. The second carrier is removed. A via is formed through the second resin and fabric to expose the first conductive layer. A second conductive layer formed in the via over the first conductive layer.

25 Claims, 15 Drawing Sheets

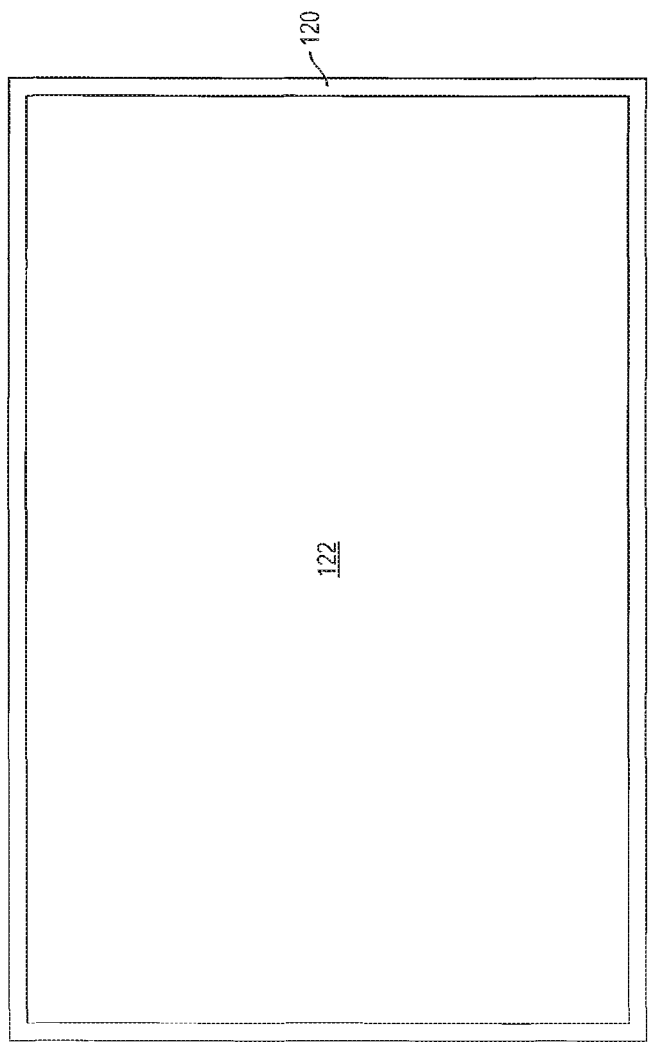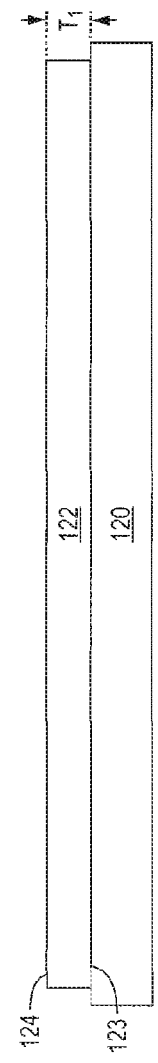
FIG. 4a
FIG. 4b

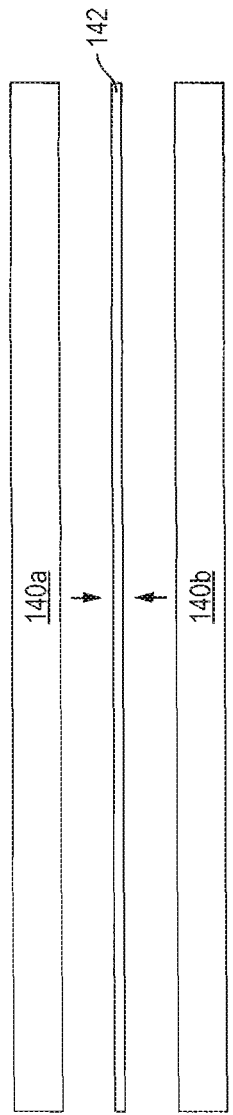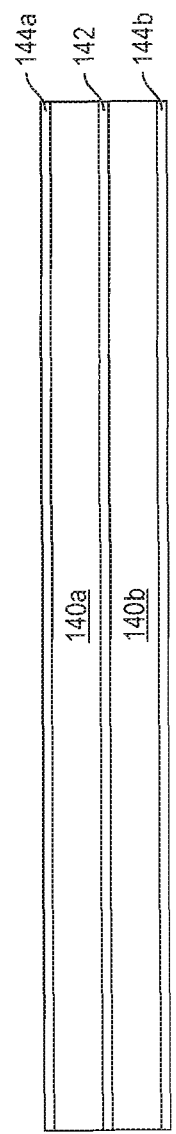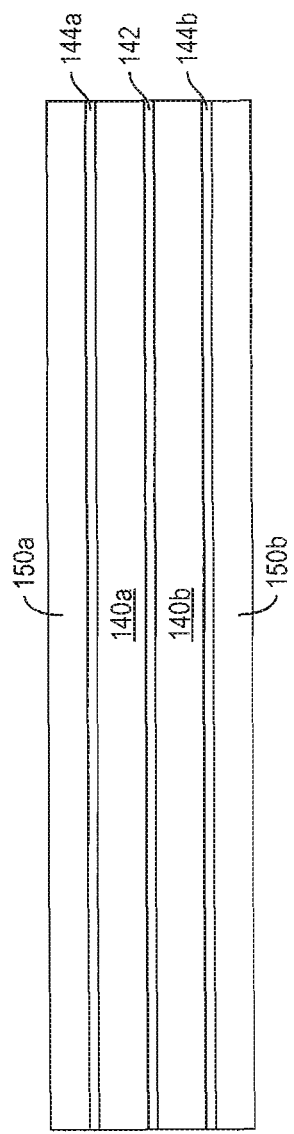

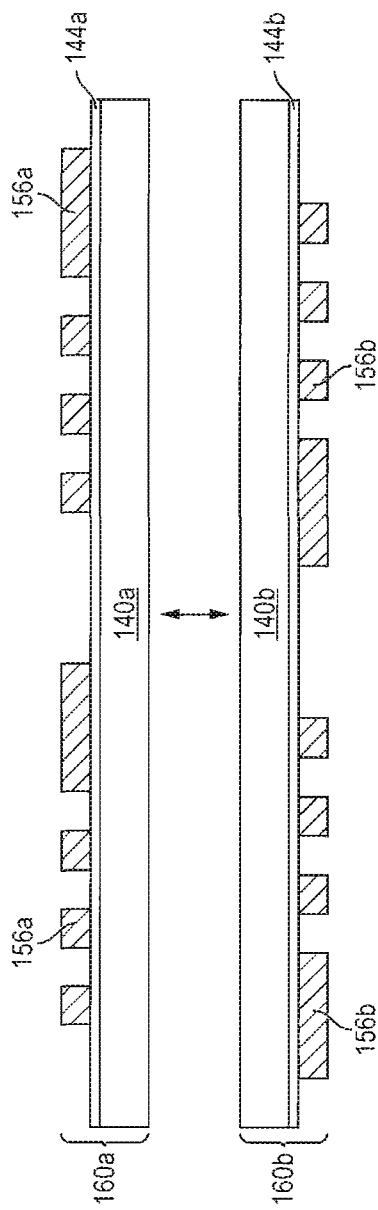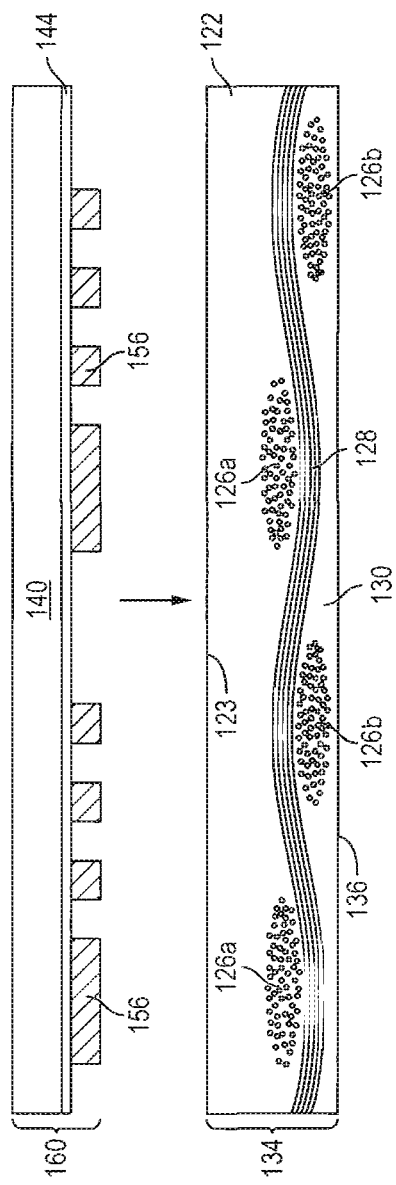

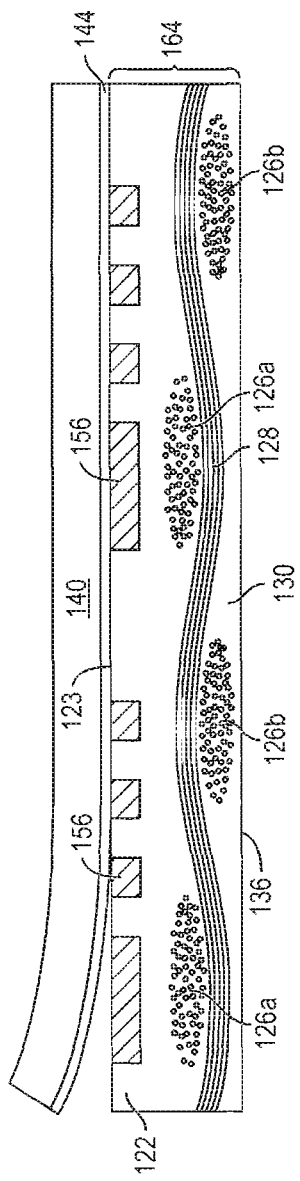
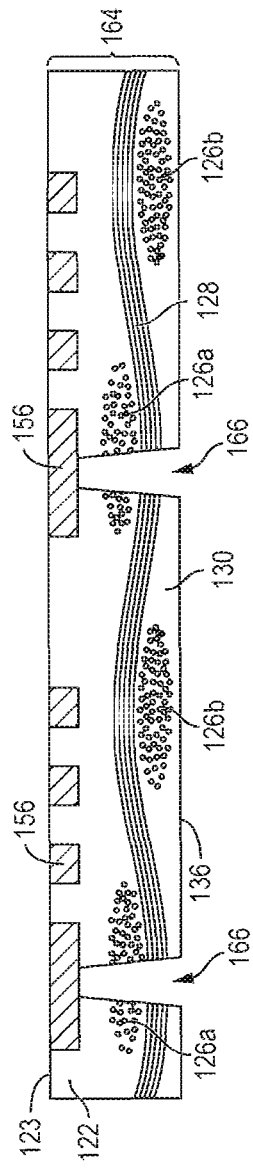
FIG. 5l
FIG. 5m

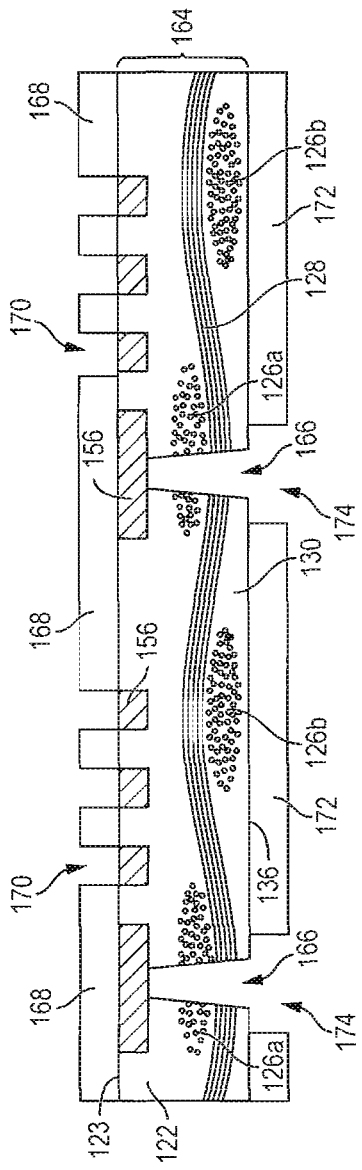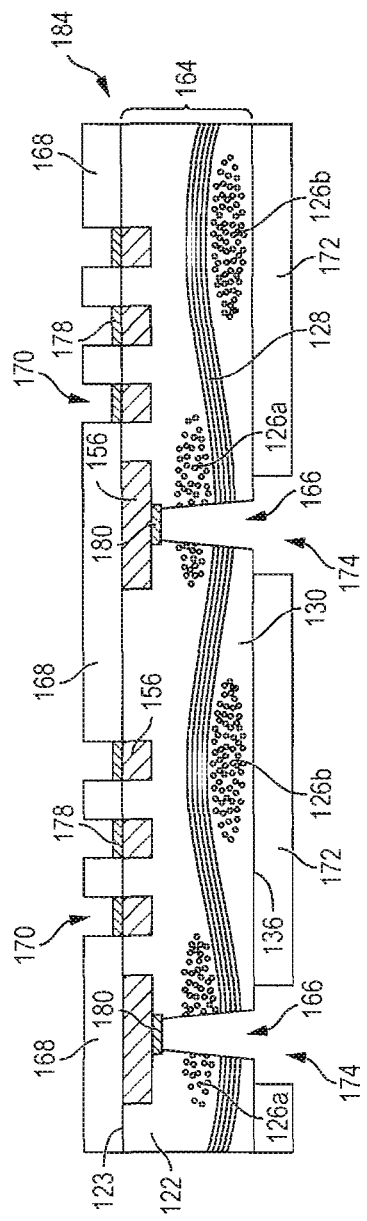

SEMICONDUCTOR DEVICE AND METHOD OF MAKING SINGLE LAYER SUBSTRATE WITH ASYMMETRICAL FIBERS AND REDUCED WARPAGE

FIELD OF THE INVENTION

The present invention relates in general to semiconductor devices and, more particularly, to a semiconductor device and method of making a single layer semiconductor substrate with asymmetrical fibers to reduce warpage using buried pattern technology.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Another goal of semiconductor manufacturing is to reduce cost and increase yields. Conventional semiconductor devices often contain semiconductor die mounted to semiconductor substrates. Because a significant portion of packaging costs are related to the costs associated with semiconductor substrates, improvements to substrate design and manufacturing further the goal of reducing costs and increasing yields. One source of decreased yields and increased manufacturing costs for substrates is excessive substrate warpage.

Accordingly, FIGS. 1a-1c serve as illustrations of substrates with excessive warpage. FIG. 1a shows a conventional semiconductor substrate or carrier used for mounting semiconductor devices. Substrate 10 can be silicon, germanium, gallium arsenide, indium phosphide, silicon carbide, polymer, beryllium oxide or other suitable rigid material for structural support. A plurality of openings or vias 12 is formed through substrate 10 using laser drilling, mechanical drilling, deep reactive ion etching (DRIE) or other suitable process.

An insulating or passivation layer 14 is formed on substrate 10. Insulating layer 14 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties, and is formed using PVD, CVD, screen printing, spin coating, spray coating, sintering or thermal oxidation.

Conductive layer 16 is formed on insulating layer 14 and over substrate 10 and vias 12 to form intermediate substrate or carrier 18. Conductive layer 16 includes one or more layers of aluminum (Al), copper (Cu), tin (Sn), nickel (Ni), gold (Au), silver (Ag), or other suitable electrically conductive material formed by electrolytic plating or electroless plating for electrical interconnect. In one embodiment, conductive layer 16 is Cu foil disposed on substrate 10 and insulating layer 14 with a hot lamination process.

In one embodiment, intermediate substrate 18 is formed in a double substrate process where first and second substrates 10 are mounted together with an interface layer, double-sided tape, thermal release layer, or other suitable material as a temporary adhesive bonding film. Vias 12, insulating layers 14, and conductive layers 16 are formed for both first and second substrates 10 while first and second substrates 10 are mounted together with the temporary adhesive bonding film. First and second substrates 10 can also undergo a full surface etching to remove a surface Cu layer that may be present on substrates 10. The removal of the temporary adhesive bonding film results in first and second intermediate substrates 18.

FIG. 1b shows an exaggerated view of the warpage W that can occur to intermediate substrate 18, including the warpage that results from separation of the intermediate substrate in a double substrate process. As shown in FIG. 1b, the warpage W is measured as the vertical displacement from the periphery of the intermediate carrier to the center of the intermediate carrier. While a double substrate process is employed to reduce warpage of intermediate substrate 18 during the formation of vias 12, insulating layer 14, and conductive layer 16, intermediate substrates 18 are subject to warpage upon splitting the intermediate carriers from each other at removal of the temporary adhesive bonding film. Warpage occurs because conductive layer 16 produces a high volume of conductive material, such as Cu, on only one side of the intermediate carrier. In one embodiment, intermediate substrate 18 has a warpage W of 2 centimeters (cm) after patterning of conductive layer 16 and further has a warpage W of 4.5 cm after both the patterning of conductive layer 16 and the formation of vias 12.

FIG. 1c shows an exaggerated view of the warpage of a final substrate or printed circuit board (PCB) 22 similar to the warpage of intermediate substrate 18 shown in FIG. 1b. In FIG. 1c, conductive layer 16 is patterned and a portion of the conductive layer is removed according to the design and function of final substrate 22. An insulating or passivation layer 24 is conformally applied over intermediate substrate 18 using PVD, CVD, screen printing, spin coating, spray coating, sintering or thermal oxidation. Insulating layer 24 contains one or more layers of SiO2, Si3N4, SiON, Ta2O5, Al2O3, or other material having similar insulating and structural properties. In one embodiment, insulating layer 24 includes a photo-sensitive resist. Insulating layer 24 follows the contours of intermediate substrate 18 and is patterned such that a portion of the insulating layer is removed to form openings 26 to expose portions of conductive layer 16 for subsequent electrical interconnect.

FIG. 1c further shows vias 12 are filled with Al, Cu, Sn, Ni, Au, Ag, titanium (Ti), tungsten (W), poly-silicon, or other suitable electrically conductive material using PVD, CVD, electrolytic plating, electroless plating process, or other suitable metal deposition process to form conductive vias 28. The formation of conductive vias 28 can also include the steps of forming and of patterning masking layers as needed.

The formation of final substrate 22 with a high volume of conductive material on only one side of the substrate produces a decreased yield of viable substrates resulting from excessive warpage. Increases in yield loss are generally greater for one level or single level substrates than for multiple level or two level substrates. In fact, increases in yield losses are also present for applications involving flexible ball grid arrays (FBGAs). Yield losses due to excessive warpage for one level substrates in FBGA applications increase on the order of thirty percent with respect to two level substrates in FBGA applications. However, reliance on two level FBGAs to offset the reduced yields of one level FBGAs increases cost through additional or more involved process steps, such as laser drilling. Thus, applications for two level and multilevel FBGA applications are more time intensive and expensive than applications for one level FBGAs.

SUMMARY OF THE INVENTION

A need exists for a simple, cost effective, and reliable single metal layer semiconductor substrate with reduced warpage. Accordingly, in one embodiment, the present invention is a method of making a semiconductor device comprising the steps of providing a first carrier having a first resin disposed over the first carrier, disposing a fabric over the first resin, forming a second resin over the first resin and around the fabric to form an asymmetrical pre-impregnated (PPG) substrate, removing the first carrier, providing a second carrier, forming a first conductive layer over the second carrier, transferring the first conductive layer from the second carrier to the first resin, and removing the second carrier.

In another embodiment, the present invention is a method of making a semiconductor device comprising the steps of providing a first carrier having a first resin disposed over the first carrier, disposing a fabric over the first resin, forming a second resin over the first resin and around the fabric to form an asymmetrical PPG substrate, and disposing a first conductive layer within the first resin.

In another embodiment, the present invention is a method of making a semiconductor device comprising the steps of providing a PPG substrate including an asymmetrically disposed fabric, and disposing a first conductive layer within the PPG substrate and offset with respect to the fabric.

In another embodiment, the present invention is a semiconductor device comprising a first resin. Fabric is disposed over the first resin. A second resin is formed over the first resin and around the fabric to form an asymmetrical PPG substrate. A first conductive layer is disposed within the first resin.

BRIEF DESCRIPTION OF THE DRAWINGS

FIGS. 4a-4f illustrate a process of forming a substrate including asymmetrically disposed fibers;

DETAILED DESCRIPTION OF THE DRAWINGS

Figure 1A:
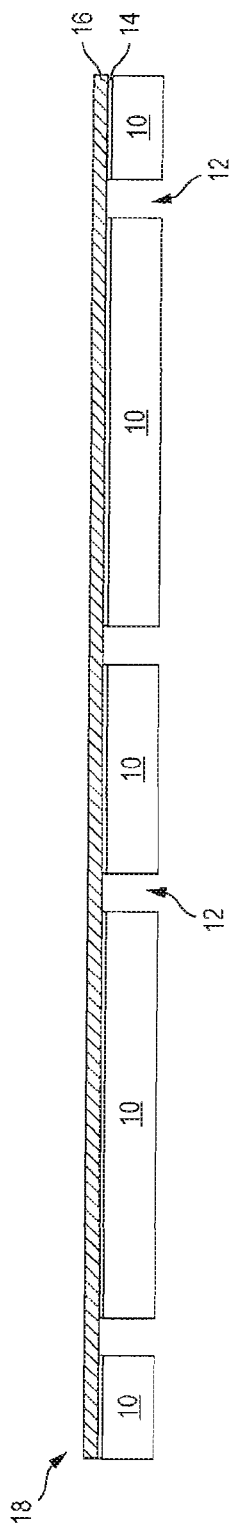
FIGS. 1a-1c illustrate a conventional semiconductor substrate and resultant warpage.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, i.e., the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
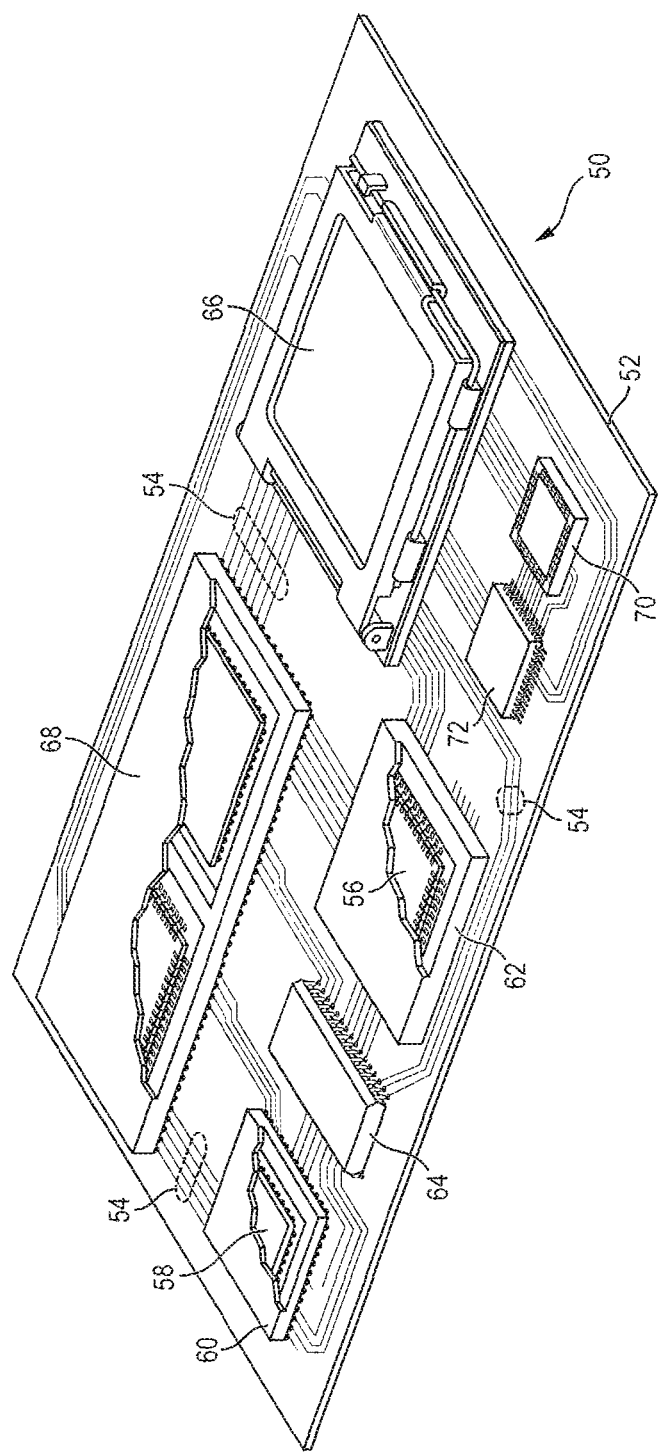
FIG. 2 illustrates a printed circuit board with different types of packages mounted to its surface.

FIG. 2 illustrates electronic device 50 having a chip carrier substrate or PCB 52 with a plurality of semiconductor packages mounted on its surface. Electronic device 50 can have one type of semiconductor package, or multiple types of semiconductor packages, depending on the application. The different types of semiconductor packages are shown in FIG. 2 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 3A:
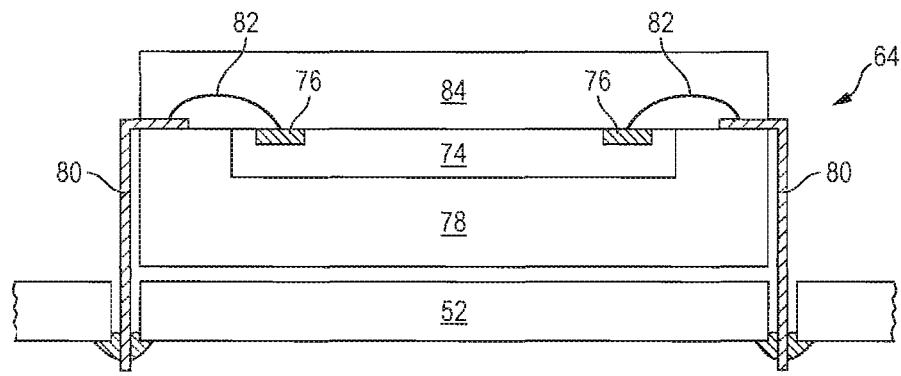
FIGS. 3a-3c illustrate further detail of the representative semiconductor packages mounted to the printed circuit board.
Figure 3B:
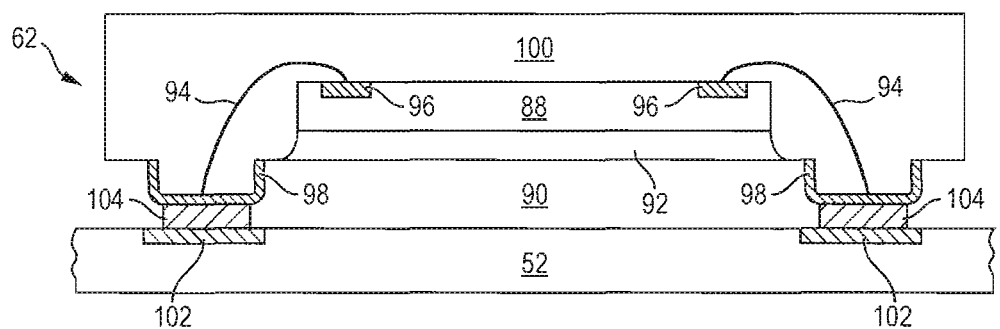
Figure 3C:
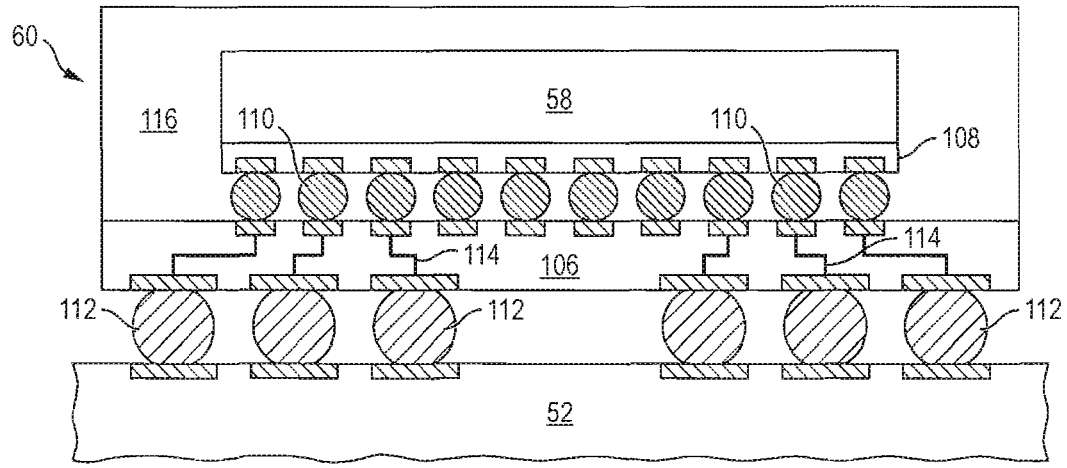

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as Al, Cu, Sn, Ni, Au, or Ag, and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 3b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 4C:
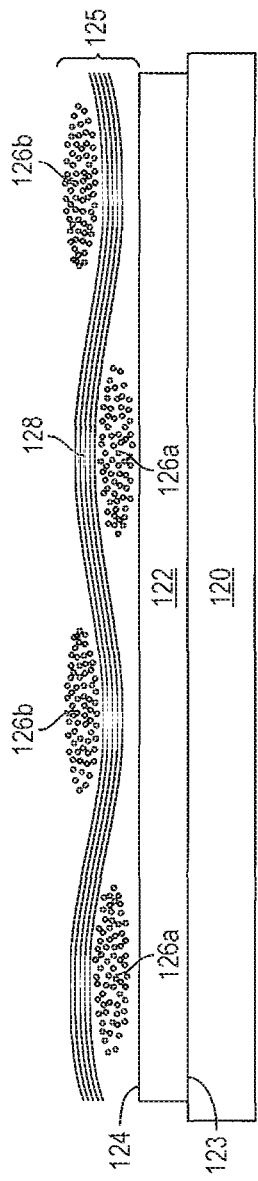

FIGS. 4a-4f and 5a-5o illustrate, in relation to FIGS. 2 and 3a-3c, a process of forming a single metal layer semiconductor substrate including asymmetrical glass fibers to reduce warpage using buried pattern technology. FIG. 4a shows a top or plan view of a temporary substrate or carrier 120 containing sacrificial base material such as silicon, polymer, beryllium oxide, glass, or other suitable low-cost, rigid material for structural support. A resin layer 122 is formed over carrier 120. Resin 122 includes epoxy, epoxy resin, polymeric materials, thermoset plastic laminate, or other non-conductive materials.

FIG. 4b shows a cross sectional view of a portion of carrier 120 and resin 122 from FIG. 4a. Resin 122 includes a bottom surface 123 and a top surface 124 opposite the bottom surface.

In one embodiment, resin 122 has a thickness T1 as measured between surface 123 and surface 124 in a range of 10-30 micrometers (μm). More specifically, in one embodiment the thickness T1 of resin 122 is approximately 10 μm. Resin 122 undergoes a curing process to partially cure the resin.

In FIG. 4c, a number of fibers or fabric 125 is disposed over resin 122 and carrier 120. Fabric 125 includes one or more layers of phenolic cotton paper, woven glass, matte glass, polyester, and other reinforcement fibers or fabrics. Fabric 125 includes a first portion of fibers 126 formed or disposed over resin 122 and oriented in first direction, and a second number of fibers 128 oriented in a second direction orthogonal to the first direction. A first portion 126a of fibers 126 is disposed below fibers 128, and a second portion 126b is disposed over fibers 128 such that fibers 128 are formed between first and second portions 126a and 126b. Fabric 125 is disposed over resin 122 after the resin has been partially cured. Resin 122 is configured such that a portion of fabric 125 can be inserted into the resin. In one embodiment, fabric 125 is T1280 glass fabric having a thickness in a range of approximately 25-50 μm and more usually having a thickness of approximately 40 μm.

Figure 4D:
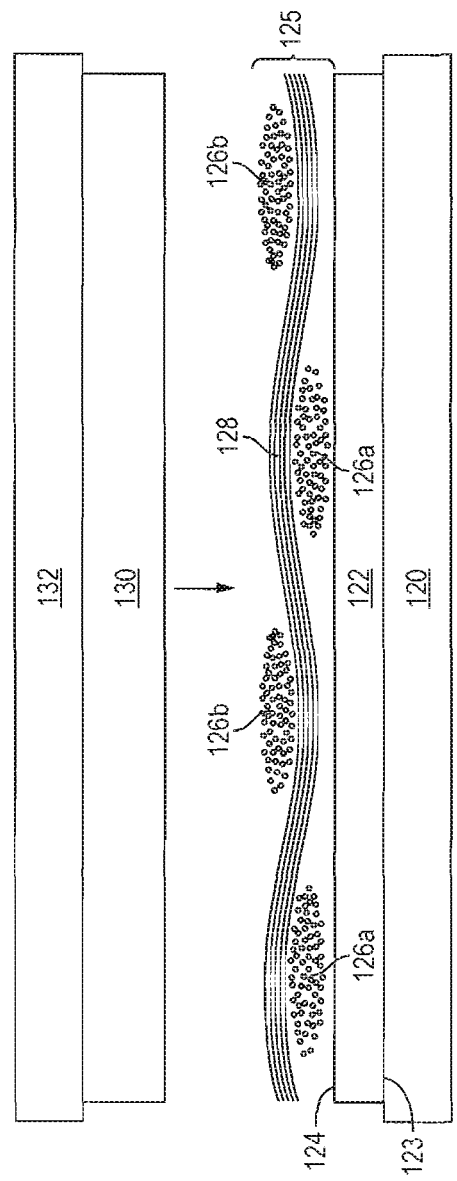

In FIG. 4d, resin 130, similar to resin 122 from FIG. 4b is disposed over carrier 132. Resin 130 is transferred from carrier 132 to over fabric 125 and resin 122. Resin 130 is symmetrically disposed around fabric 125 and contacts resin 122 to enclose fabric 125 within resins 122 and 130. Resin 130, like resin 122, undergoes a curing process and is partially cured before removal of carrier 120.

Figure 4E:
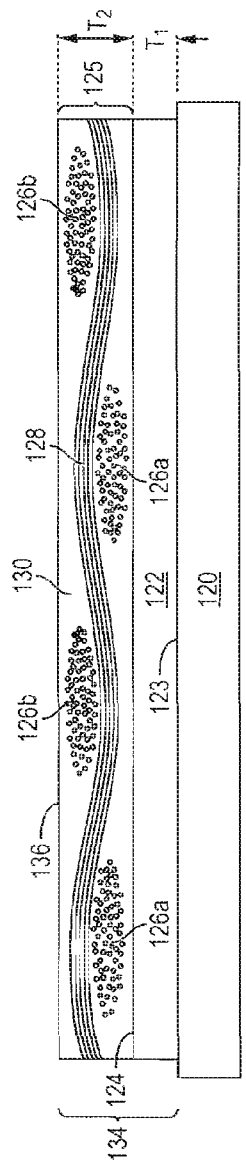

FIG. 4e shows resin 122, fabric 125, and resin 130 joined over carrier 120 to form an assymetrical PPG substrate 134. Fabric 125 is symmetrically formed within resin 130, but is assymetrically formed with respect to surface 123 of resin 122 and top surface 136 of resin 130. Because fabric 125 is disposed over, but not substantially impregnated within resin 122, the fabric is offset a distance of T1 from surface 123. Thus, with the subsequent symmetrical impregnation of fabric 125 within resin 130 to form PPG substrate 134, the PPG substrate includes asymmetrically disposed fabric 125. In one embodiment, the thickness T1 of resin 122 is 10 μm, and a thickness T2 of fabric 125 surrounded by resin 130 is 50 μm for a total thickness of PPG substrate 134 after lamination of 60 μm. More generally, PPG substrate 134 has a thickness in a range of approximately 50-60 μm. The thickness T1 of resin 122 is sufficient to contain a subsequently formed conductive layer, while the overall thickness of PPG substrate 134 provides a thin substrate offering reduced warpage. PPG substrate 134 can also be one or more laminated layers of PPG polytetrafluoroethylene, FR-4, FR-1, CEM-1, or CEM-3 with a combination of phenolic cotton paper, epoxy, resin, woven glass, matte glass, polyester, and other reinforcement fibers or fabrics.

Figure 4F:
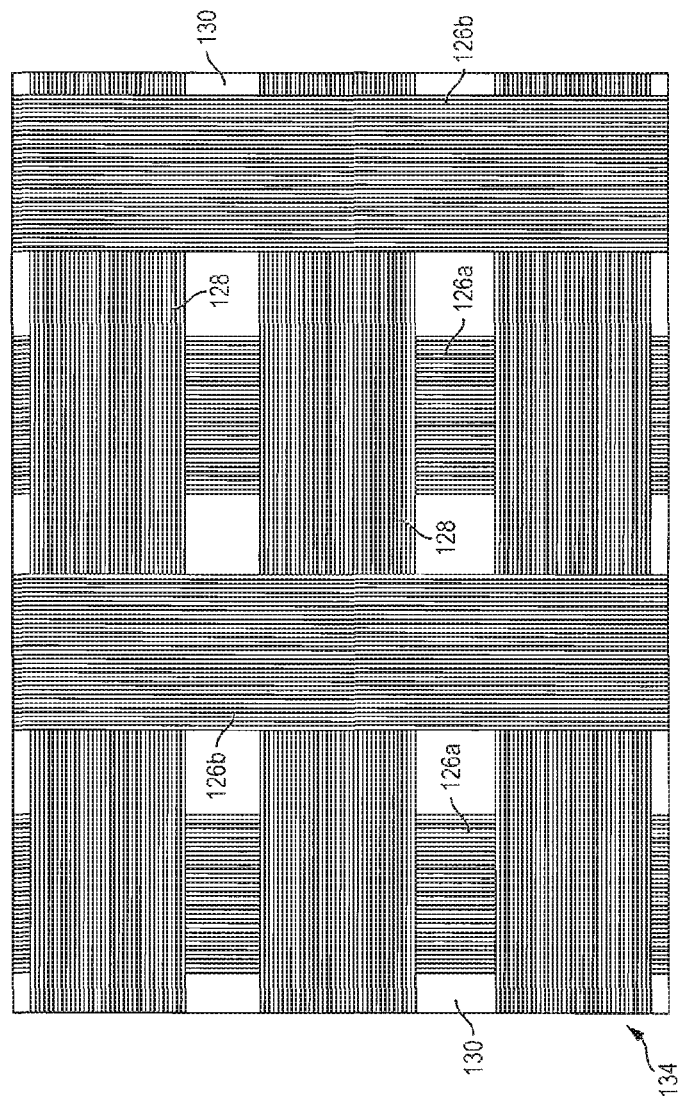

FIG. 4f shows a top or plan view of asymmetrical PPG 134 from FIG. 4e. First portion 126a of fibers 126 are shown at a first level laminated within resin 130. The second number of fibers 128 is oriented in a second direction, including angled or orthogonal with respect to the first direction, and are shown vertically offset from the first portion 126a of fibers 126. The second portion 126b of fibers 126 is formed over fibers 128 such that fibers 128 are disposed between first and second portions 126a and 126b. The second portion 126b of fibers 126 are oriented in a direction that is angled with respect to fibers 128, and in one embodiment are substantially parallel with fibers 126a. Carrier 120 is removed from completed PPG substrate 134, and the PPG substrate is ready for use in a subsequent manufacturing step.

Figure 5A:
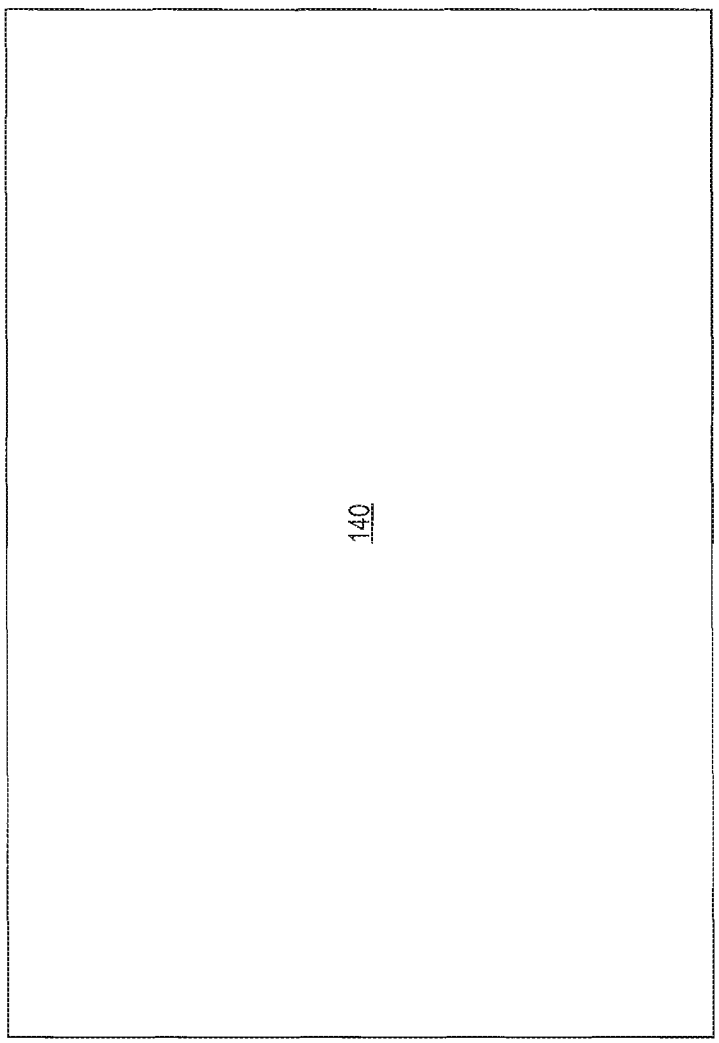
FIGS. 5a-5o illustrate a process of forming a single metal layer semiconductor substrate with buried pattern technology and asymmetrical glass fibers to reduce warpage.
Figure 5B:
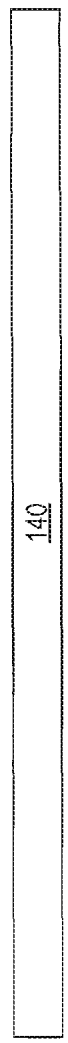

FIG. 5a shows a top or plan view of substrate or temporary carrier 140. Temporary carrier 140 contains base material such as, silicon, polymer, polymer composite, ceramic, glass, glass epoxy, beryllium oxide, or other suitable low-cost, rigid material or bulk semiconductor material for structural support. In one embodiment, temporary carrier 140 is a metal carrier. FIG. 5b shows a cross-sectional view of a portion of temporary carrier 140.

In FIG. 5c, first and second temporary carriers 140a and 140b, similar to temporary carrier 140 from FIG. 5b are mounted together with interface layer 142. Interface layer 142 includes, temporary adhesives, thermally releasable layers, bonding film, double sided tape, and other suitable materials. In one embodiment, interface layer 142 is formed over temporary carrier 140a and then mounted to temporary carrier 140b. Alternatively, interface layer 142 is formed over temporary carrier 140b and then mounted to temporary carrier 140a. Interface layer 142 serves to temporarily bond temporary carriers 140a and 140b, and as a release layer during a subsequent manufacturing step.

FIG. 5d shows temporary carriers 140a and 140b mounted together with interface layer 142 for dual side processing. Interface layers 144a and 144b are formed on surfaces of temporary carriers 140a and 140b, respectively, opposite interface layer 142. Interface layers 144a and 144b include, temporary adhesives, thermally releasable layers, bonding film, double sided tape, and other suitable materials.

In FIG. 5e, insulating or passivation layer 150a is deposited over temporary carrier 140a and interface layer 144a. Similarly, insulating or passivation layer 150b is deposited over temporary carrier 140b and thermally interface layer 144b as part of a dual side process. Insulating layers 150a and 150b are deposited using PVD, CVD, printing, spin coating, spray coating, screen printing, lamination, or other suitable process. Insulating layers 150a and 150b contain one or more layers of SiO2, Si3N4, SiON, Ta2O5, Al2O3, photosensitive or non-photosensitive polymer dielectric, or other material having similar insulating and structural properties.

Figure 5F:
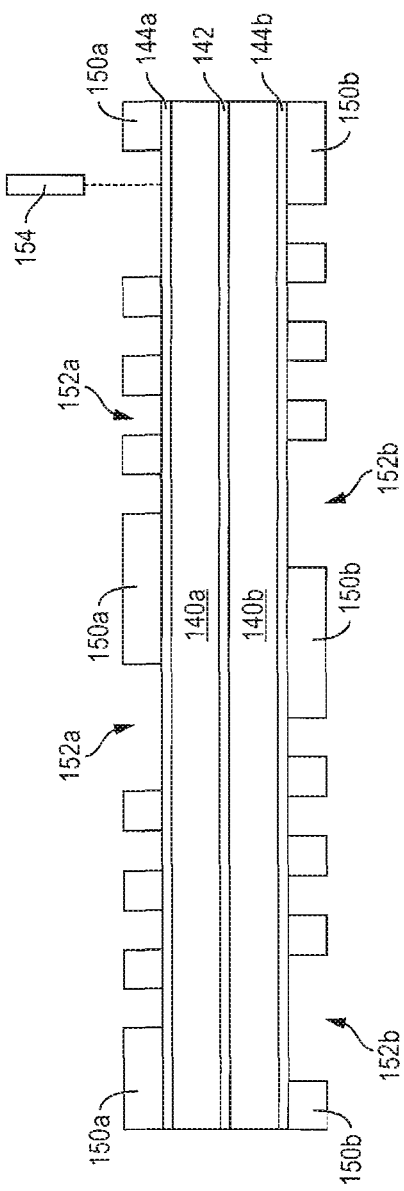

In FIG. 5f, portions of insulating layers 150a and 150b are removed to form openings 152a and 152b in insulating layers 150a and 150b, respectively. Openings 152a and 152b are formed using a plasma process, wet chemical etching, or photoresist developing process. In one embodiment, openings 152a and 152b are formed by laser direct ablation (LDA) with laser 154. Openings 152a and 152b are patterned according to the desired configuration and functional requirements of a later formed redistribution layer (RDL).

Figure 5G:
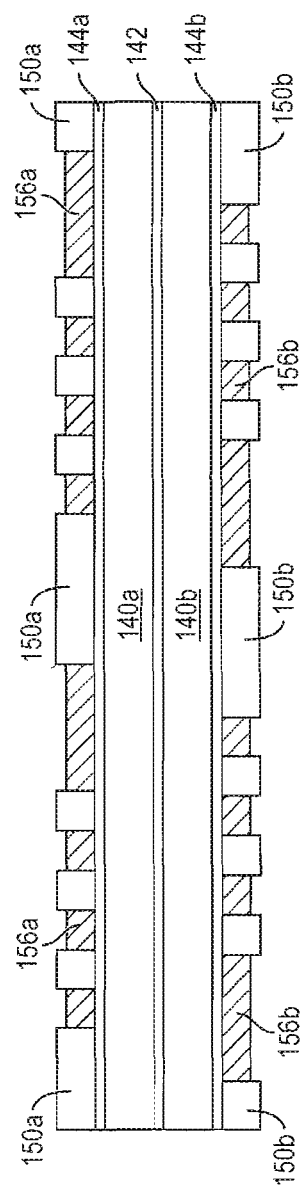

In FIG. 5g, electrically conductive layers or RDLs 156a and 156b are formed over the exposed interface layers 144a and 144b, respectively, and further with openings 152a and 152b, respectively. Conductive layers 156a and 156b are formed using a patterning and metal deposition process such as printing, PVD, CVD, sputtering, electrolytic plating, and electroless plating. Conductive layers 156a and 156b can be one or more layers of Al, Cu, Sn, Ni, Au, Ag, or other suitable electrically conductive material. Conductive layers 156a and 156b are electrically common or electrically isolated depending on the design and function of the subsequently formed single metal layer semiconductor substrate.

In FIG. 5h, remaining portions of insulating layers 150a and 150b are removed from over temporary carriers 140a and 140b to expose conductive layers 156a and 156b. The remaining portions of insulating layers 150a and 150b are removed using a plasma process, wet chemical etching, LDA, or other suitable process to form transfer substrates 160a and 160b. FIG. 5h further shows the separation of transfer substrates 160a and 160b by debonding interface layer 142. In one embodiment, interface layer 142 is a thermally releasable layer that is thermally activated to separate transfer substrates 160a and 160b.

Figure 5J:
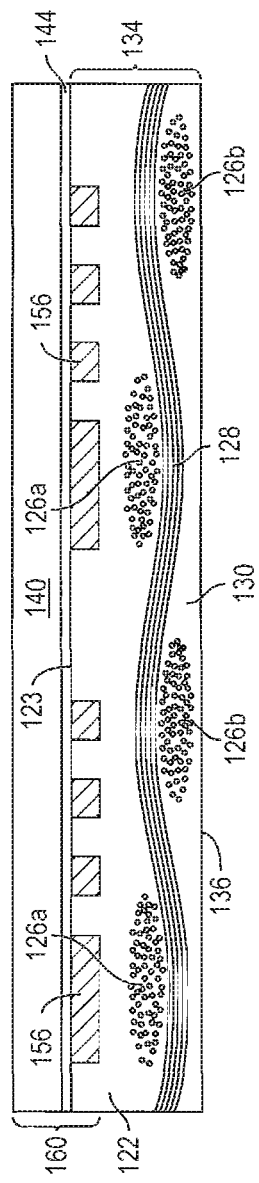

FIG. 5i shows a transfer substrate 160 from FIG. 5h is positioned over PPG substrate 134 with conductive layer 156 oriented toward resin 122. Conductive layer 156 is pressed into resin 122 such that interface layer 144 contacts surface 123 of resin 122. FIG. 5j shows transfer substrate 160 mounted to PPG substrate 134 with conductive layer 156 pressed into resin 122. In one embodiment, the thickness T1 of resin 122 is sufficiently large that conductive layer 156 does not contact fibers 126 or 128. Conductive layer 156 is contained within resin 122, which is offset from asymmetrically positioned fabric 125. Conductive layer 156 can be transferred to resin 122 using a vacuum press.

Figure 5K:
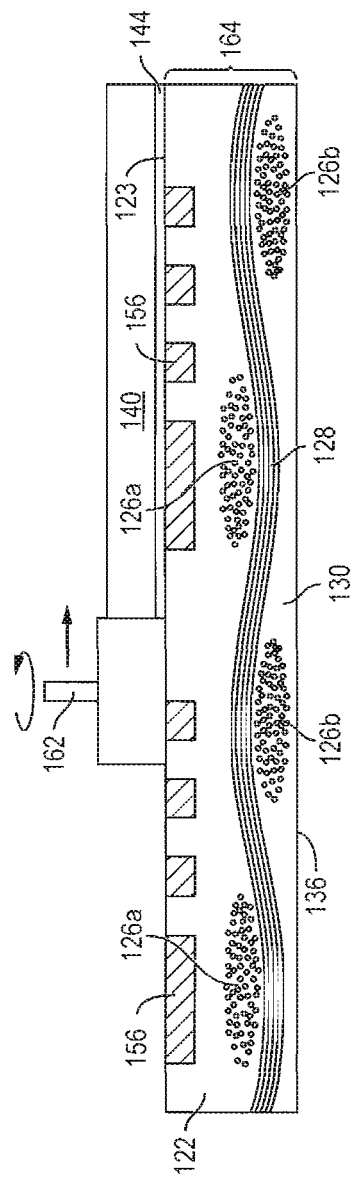

After the transfer of conductive layer 156 to PPG substrate 134, temporary carrier 140 and interface layer 144 are removed by chemical etching, mechanical peeling, CMP, mechanical grinding, thermal bake, UV light, laser scanning, wet stripping, or other suitable process to expose a surface of PPG substrate 134. For example, FIG. 5k shows temporary carrier 140 and interface layer 144 undergo a grinding operation with grinder 162 to remove the carrier and interface layer. Alternatively, FIG. 5l shows temporary carrier 140 is removed by debonding interface layer 144, which is also a thermally releasable layer, and further shows removing temporary carrier 140 and interface layer 144 by mechanical peeling.

Figure 1B:
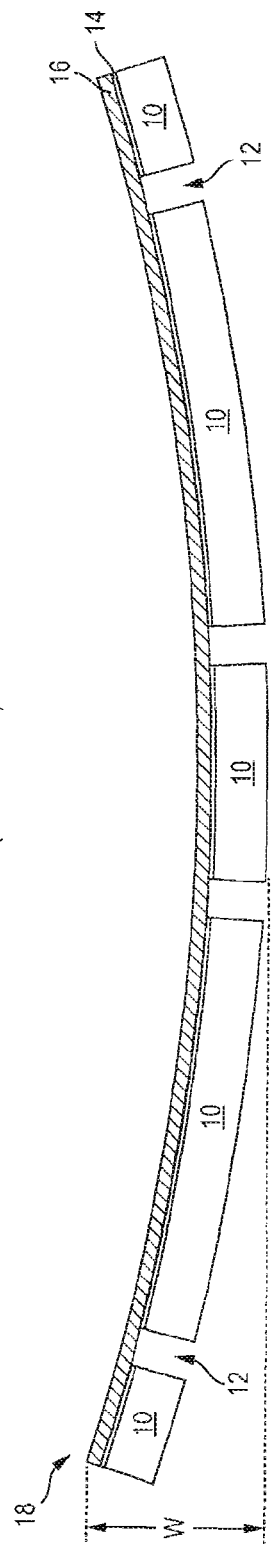
Figure 1C:
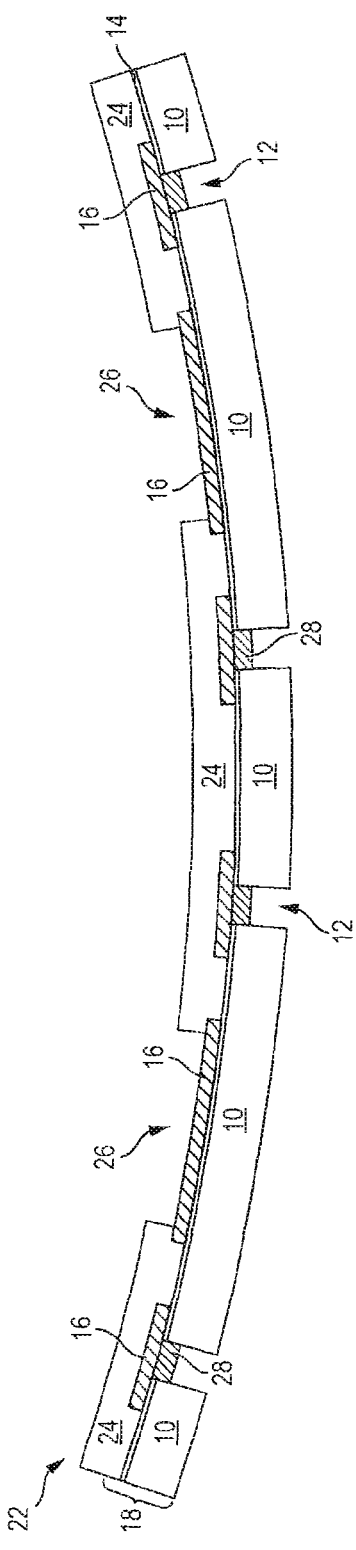

Thus, with the removal of temporary carrier 140, and the separation of transfer substrate 160, conductive layer 156 is transferred to resin 122 and PPG substrate 134 using buried pattern technology. The inclusion of conductive layer 156 within PPG substrate 134 results in a single metal layer semiconductor substrate with asymmetrical glass fibers 164. Substrate 164 experiences less warpage than conventional single layer substrates for multiple reasons. Research into warpage in conventional single layer substrates revealed that the single layer of conductive material, including a Cu layer formed as a panel, was the main cause of warpage. Because conductive layer 156 is patterned before being incorporated as part of substrate 164, the volume of conductive material embedded within the substrate is less than an amount of conductive material present in conventional methods. For example, as discussed above, FIGS. 1a and 1b show intermediate substrate 18 with warpage W that results from an amount of conductive material present in unpatterned conductive layer 16. Patterning of conductive layer 16 occurs after the formation of conductive layer 16 over substrate 10. By utilizing buried pattern technology to transfer patterned conductive layer 156 to PPG 134 in the formation of substrate 164, the reduced conductive material in conductive layer 156 reduces warpage issues for substrate 164 promoting a more planar profile. Furthermore, forces exerted on substrate 164 by embedded conductive layer 156, particularly at surface 123 of the substrate, are balanced by fabric 125 that is asymmetrically disposed between surfaces 123 and 136. Thus, by balancing opposing forces between conductive layer 156 at surface 123 and fabric 125 near surface 136, warpage of substrate 164 is reduced.

In FIG. 5m, a plurality of openings or vias 166 is formed in substrate 164 that extend partially, but not completely through the substrate. Vias 166 extend from surface 136, through resin 130, through fabric 125, and through resin 122 to conductive layer 156. Vias 166 are formed using laser drilling, mechanical drilling, DRIE, LDA, or other suitable process. Vias 166 provide for subsequent through electrical interconnect between opposing surfaces 123 and 136 of substrate 164.

In FIG. 5n, insulating or passivation layer 168 is formed over surface 123 of substrate 164 and contacts both resin 122 and conductive layer 156. Insulating layer 168 is deposited using PVD, CVD, printing, spin coating, spray coating, screen printing, lamination, or other suitable process. Insulating layer 168 contains one or more layers of SiO2, Si3N4, SiON, Ta2O5, Al2O3, photosensitive or non-photosensitive polymer dielectric, solder resist, or other material having similar insulating and structural properties. Insulating layer 168 is patterned such that a portion of the insulating layer is removed to form openings 170 that expose portions of conductive layer 156 for subsequent electrical interconnect.

Similarly, insulating or passivation layer 172 is formed over surface 136 of substrate 164. Insulating layer 172 is deposited using PVD, CVD, printing, spin coating, spray coating, screen printing, lamination, or other suitable process. Insulating layer 172 contains one or more layers of SiO2, Si3N4, SiON, Ta2O5, Al2O3, photosensitive or non-photosensitive polymer dielectric, solder resist, or other material having similar insulating and structural properties. Insulating layer 172 is patterned such that a portion of the insulating layer is removed to form openings 174 that expose portions of substrate 164 and vias 166 for subsequent electrical interconnect.

In FIG. 5o, conductive layer 178 is formed over an exposed portion of conductive layer 156 in openings 170 using a patterning and metal deposition process such as printing, PVD, CVD, sputtering, electrolytic plating, and electroless plating. Conductive layer 178 can be one or more layers of Al, Cu, Sn, Ni, Au, Ag, or other suitable electrically conductive material. Similarly, conductive layer 180 is formed over an exposed portion of conductive layer 156 in vias 166 using a patterning and metal deposition process such as printing, PVD, CVD, sputtering, electrolytic plating, and electroless plating. Conductive layer 180 can be one or more layers of Al, Cu, Sn, Ni, Au, Ag, or other suitable electrically conductive material. Conductive layers 178 and 180 are formed according to the design and function of semiconductor substrate 184.

Accordingly, forming a single metal layer semiconductor substrate using buried pattern technology including asymmetrical glass fibers reduces warpage. Conventional single level substrates with high volumes of conductive material on only one side of the substrate produce decreased yields of viable substrates resulting from excessive warpage. Multiple level substrates, while offsetting the reduced yields of single level substrates, increase cost through additional or more involved process steps. Research into warpage in conventional single layer substrates revealed that the single layer of conductive material, including a Cu layer formed as a panel, was the main cause of warpage.

Consistent with the foregoing, PPG substrate 134 includes fabric 125 that is symmetrically formed within resin 130, but is assymetrically formed with respect to surface 123 of resin 122 and top surface 136 of resin 130. In one embodiment, the thickness T1 of resin 122 is 10 µm, and a thickness T2 of fabric 125 surrounded by resin 130 is 50 µm for a total thickness of PPG substrate 134 after lamination of 60 µm. The thickness T1 of resin 122 is sufficient to contain subsequently formed conductive layer 156, while the overall thickness of PPG substrate 134 provides a thin substrate offering reduced warpage. Conductive layer 156 is transferred to resin 122 and PPG substrate 134 using buried pattern technology resulting in a single metal layer semiconductor substrate 164 with asymmetrical glass fibers. Because conductive layer 156 is patterned before being incorporated as part of substrate 164, the volume of conductive material embedded within the substrate is less than an amount of conductive material present in conventional methods. By utilizing buried pattern technology to transfer patterned conductive layer 156 to PPG 134 in the formation of substrate 164, the reduced conductive material in conductive layer 156 reduces warpage issues for substrate 164 promoting a more planar profile. Furthermore, forces exerted on substrate 164 by embedded conductive layer 156, particularly at surface 123 of the substrate, are balanced by fabric 125 that is asymmetrically disposed between surfaces 123 and 136. Thus, by balancing opposing forces between conductive layer 156 at surface 123 and fabric 125 near surface 136, warpage of substrate 164 is reduced.

Furthermore, the method of making the semiconductor device includes removing a portion of conductive layer 156 before transferring conductive layer 156 to resin 122. The method further includes forming conductive layer 156 over temporary carrier 140 in dual sided processing using interface layers 142 and 144. Fabric 125 includes one or more layers of phenolic cotton paper, woven glass, matte glass, or polyester with a thickness in a range of approximately 25-50 μm. Conductive layer 156 is oriented asymmetrically within resins 122 and 130 such that the conductive layer 156 is offset with respect to fabric 125 to minimize warpage. The method further includes forming vias 166 through resin 130 and fabric 125 to expose conductive layer 156. The method also includes forming conductive layer 180 in vias 166 and over conductive layer 156.

Figure 6A:
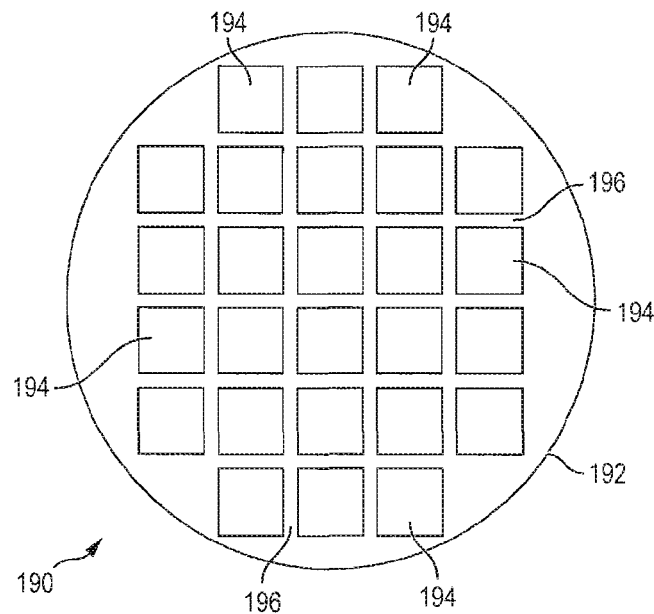
FIGS. 6a-6c illustrate a semiconductor wafer with a plurality of semiconductor die separated by saw streets.

FIG. 6a shows a semiconductor wafer 190 with a base substrate material 192, such as silicon, germanium, gallium arsenide, indium phosphide, or silicon carbide, for structural support. A plurality of semiconductor die or components 194 is formed on wafer 190 separated by a non-active, inter-die wafer area or saw street 196 as described above. Saw street 196 provides cutting areas to singulate semiconductor wafer 190 into individual semiconductor die 194.

Figure 6B:
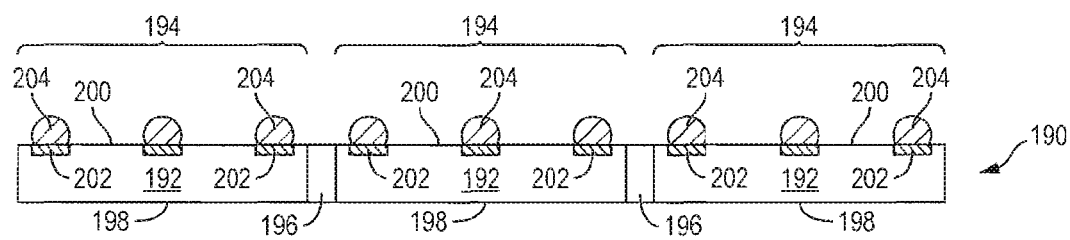

FIG. 6b shows a cross-sectional view of a portion of semiconductor wafer 190. Each semiconductor die 194 has a back surface 198 and active surface 200 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 200 to implement analog circuits or digital circuits, such as digital signal processor (DSP), ASIC, memory, or other signal processing circuit. Semiconductor die 194 may also contain integrated passive devices (IPDs), such as inductors, capacitors, and resistors, for RF signal processing. In one embodiment, semiconductor die 194 is a flipchip type device.

An electrically conductive layer 202 is formed over active surface 200 using PVD, CVD, electrolytic plating, electroless plating process, or other suitable metal deposition process. Conductive layer 202 can be one or more layers of Al, Cu, Sn, Ni, Au, Ag, or other suitable electrically conductive material. Conductive layer 202 operates as contact pads electrically connected to the circuits on active surface 200. Conductive layer 202 can be formed as contact pads disposed side-by-side a first distance from the edge of semiconductor die 194, as shown in FIG. 3b. Alternatively, conductive layer 202 can be formed as contact pads that are offset in multiple rows such that a first row of contact pads is disposed a first distance from the edge of the die, and a second row of contact pads alternating with the first row is disposed a second distance from the edge of the die.

An electrically conductive bump material is deposited over contact pads 202 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 202 using a suitable attachment or bonding process. In one embodiment, the bump material is reflowed by heating the material above its melting point to form balls or bumps 204. In some applications, bumps 204 are reflowed a second time to improve electrical contact to contact pads 202. Bumps 204 can also be compression bonded or thermocompression bonded to contact pads 202. Bumps 204 represent one type of interconnect structure that can be formed over contact pads 202. The interconnect structure can also use stud bump, micro bump, or other electrical interconnect.

Figure 6C:
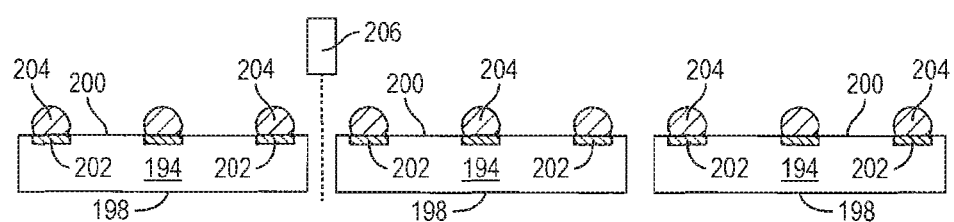

In FIG. 6c, semiconductor wafer 190 is singulated through saw street 196 using a saw blade or laser cutting tool 206 into individual semiconductor die 194.

Figure 7:
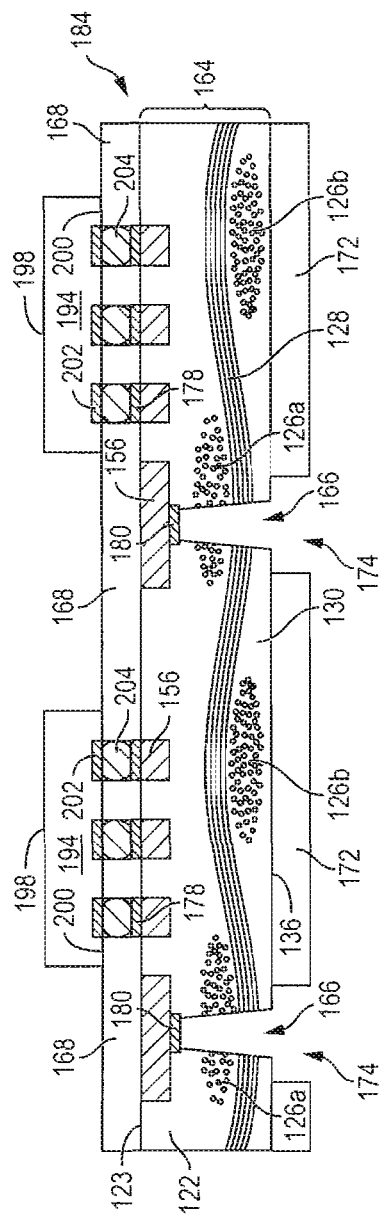
FIG. 7 illustrates semiconductor die mounted to a single metal layer semiconductor substrate with buried pattern technology and asymmetrical glass fibers to reduce warpage.

In FIG. 7, semiconductor die 194 from FIG. 6c are mounted to semiconductor substrate 184 from FIG. 5o. Semiconductor die 194 are electrically connected to conductive layer 156, and in one embodiment, are positioned with active surface 200 oriented toward insulating layer 168 and conductive layer 156. Bumps 204 are bonded to conductive layer 178 using a suitable attachment or bonding process. Bumps 204 can be reflowed by heating the bumps above their melting point to connect to conductive layer 178. In some applications, bumps 204 are reflowed a second time to improve electrical connection with conductive layer 178 and conductive layer 156. Bumps 204 can also be compression bonded or thermocompression bonded to conductive layer 178. Accordingly, by mounting semiconductor die 194 to semiconductor substrate 184, the single metal layer semiconductor substrate provides structural support and electrical connectivity for the semiconductor die while reducing warpage through the use of the buried pattern technology and asymmetrically disposed glass fibers.

While one or more embodiments of the present invention have been illustrated in detail, the skilled artisan will appreciate that modifications and adaptations to those embodiments may be made without departing from the scope of the present invention as set forth in the following claims.

What is claimed:
1. A method of making a semiconductor device, comprising:
    providing a first carrier having a first resin disposed over the first carrier;
    disposing a fabric over the first resin;
    forming a second resin over the first resin and around the fabric to form an asymmetrical pre-impregnated (PPG) substrate;
    removing the first carrier;
    providing a second carrier;
    forming a first conductive layer over the second carrier;
    transferring the first conductive layer from the second carrier to the first resin; and
    removing the second carrier.
2. The method of claim 1, further including removing a portion of the first conductive layer before transferring the first conductive layer to the first resin.

3. The method of claim 1, wherein the first conductive layer is formed over the second carrier in dual sided processing using interface layers.

4. The method of claim 1, wherein the fabric includes one or more layers of phenolic cotton paper, woven glass, matte glass, or polyester with a thickness in a range of 25-50 micrometers.

5. The method of claim 1, wherein the first conductive layer is oriented asymmetrically within the first and second resins such that the first conductive layer is offset with respect to the fabric to minimize warpage.

6. The method of claim 1, further including:
forming a via through the second resin and fabric to expose the first conductive layer;
forming a second conductive layer in the via over the first conductive layer; and
mounting a semiconductor die to the first conductive layer.

7. A method of making a semiconductor device, comprising:
providing a first carrier having a first resin disposed over the first carrier;
disposing a fabric over the first resin;
forming a second resin over the first resin and around the fabric to form an asymmetrical pre-impregnated (PPG) substrate; and
disposing a first conductive layer within the first resin.

8. The method of claim 7, further including removing a portion of the first conductive layer before disposing the first conductive layer within the first resin.

9. The method of claim 7, wherein the first conductive layer is formed over a second carrier in dual sided processing using interface layers.

10. The method of claim 7, wherein the fabric includes one or more layers of phenolic cotton paper, woven glass, matte glass, or polyester with a thickness in a range of 25-50 micrometers.

11. The method of claim 7, wherein the first conductive layer is oriented asymmetrically within the first and second resins such that the first conductive layer is offset with respect to the fabric to minimize warpage.

12. The method of claim 7, further including:
forming a via through the PPG substrate to expose the first conductive layer;
forming a second conductive layer in the via over the first conductive layer; and
mounting a semiconductor die to the first conductive layer.

13. A method of making a semiconductor device, comprising:
providing a pre-impregnated (PPG) substrate including an asymmetrically disposed fabric; and
disposing a first conductive layer within the PPG substrate and offset with respect to the fabric.

14. The method of claim 13, wherein providing the PPG substrate includes:

providing a first carrier having a first resin disposed over the first carrier;
disposing the fabric over the first resin; and
forming a second resin over the first resin and around the fabric.

15. The method of claim 13, further including removing a portion of the first conductive layer before disposing the first conductive layer within the PPG substrate.

16. The method of claim 13, wherein the first conductive layer is formed over a second carrier in dual sided processing using interface layers.

17. The method of claim 13, wherein the fabric includes one or more layers of phenolic cotton paper, woven glass, matte glass, or polyester with a thickness in a range of 25-50 micrometers.

18. The method of claim 13, wherein the first conductive layer is oriented asymmetrically within the PPG substrate such that the first conductive layer is offset with respect to the fabric to minimize warpage.

19. The method of claim 13, further including:
forming a via through the PPG substrate to expose the first conductive layer;
forming a second conductive layer in the via over the first conductive layer; and
mounting a semiconductor die to the first conductive layer.

20. A semiconductor device, comprising:
a first resin;
fabric disposed over the first resin;
a second resin formed over the first resin and around the fabric to form an asymmetrical pre-impregnated (PPG) substrate; and
a first conductive layer disposed within the first resin.

21. The semiconductor device of claim 20, wherein the first conductive layer is patterned to reduce a volume of conductive material and reduce warpage of the PPG substrate.

22. The semiconductor device of claim 20, wherein the first conductive layer is formed over the PPG substrate to form a single metal layer semiconductor substrate having a thickness of less than 60 micrometers.

23. The semiconductor device of claim 20, wherein the fabric includes one or more layers of phenolic cotton paper, woven glass, matte glass, or polyester with a thickness in a range of 25-50 micrometers.

24. The semiconductor device of claim 20, wherein the first conductive layer is offset with respect to the fabric to minimize warpage.

25. The semiconductor device of claim 20, further including:
a via formed through the PPG substrate to expose the first conductive layer;
a second conductive layer formed in the via over the first conductive layer; and
a semiconductor die mounted to the first conductive layer.

* * * * *